(12) United States Patent
Brox et al.

(10) Patent No.: US 11,262,780 B1
(45) Date of Patent: Mar. 1, 2022

(54) BACK-BIAS OPTIMIZATION

(71) Applicant: Micron Technology, Inc., Boise, ID (US)

(72) Inventors: Martin Brox, Munich (DE); Satoru Sugimoto, Sagamihara (JP); Elena Cabrera Bernal, Munich (DE); Jan Pottgiesser, Kirchheim (DE); Sven Piatkowski, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/096,225

(22) Filed: Nov. 12, 2020

(51) Int. Cl.
*G05F 1/10* (2006.01)
*G05F 3/20* (2006.01)
*G11C 5/14* (2006.01)

(52) U.S. Cl.
CPC ............. *G05F 3/205* (2013.01); *G11C 5/146* (2013.01)

(58) Field of Classification Search
None
See application file for complete search history.

(56) References Cited

U.S. PATENT DOCUMENTS

| | | | | |
|---|---|---|---|---|
| 6,046,627 A * | 4/2000 | Itoh | ................ | H03K 19/0013 327/546 |
| 6,285,213 B1 * | 9/2001 | Makino | ............ | H03K 3/356008 326/81 |
| 6,518,825 B2 * | 2/2003 | Miyazaki | ................ | G11C 5/143 327/534 |
| 7,015,741 B2 * | 3/2006 | Tschanz | .................... | G06F 1/10 327/295 |
| 7,060,566 B2 * | 6/2006 | Vogelsang | .......... | H01L 27/0925 438/270 |
| 7,436,206 B2 * | 10/2008 | Kurotsu | ................ | G11C 11/417 326/31 |
| 7,612,604 B2 * | 11/2009 | Miyazaki | ............ | H01L 27/0928 327/534 |
| 7,920,019 B2 * | 4/2011 | Bertram | ............. | H01L 27/0928 327/537 |
| 7,978,001 B2 * | 7/2011 | Bertram | ............. | H03K 19/0016 327/534 |
| 8,222,951 B2 * | 7/2012 | Tanaka | ................ | H01L 27/0222 327/534 |
| 9,112,495 B1 * | 8/2015 | Clark | ..................... | H03K 3/012 |
| 9,251,866 B2 * | 2/2016 | Chun | ............... | H03K 19/00315 |
| 2008/0174359 A1 * | 7/2008 | Osada | ................ | H03K 19/0008 327/534 |

* cited by examiner

*Primary Examiner* — Thomas J. Hiltunen
(74) *Attorney, Agent, or Firm* — Holland & Hart LLP

(57) ABSTRACT

Methods, systems, and devices for back-bias optimization are described. An apparatus, such as an electronic apparatus, may include a first substrate region and a second substrate region. The apparatus may also include a voltage generator that is disposed on the first substrate region and that includes an output terminal coupled with a conductive path. The apparatus may also include a set of clamp circuits disposed on the second substrate region. The set of clamp circuits may be configured selectively couple the conductive path with a voltage supply.

24 Claims, 4 Drawing Sheets

US 11,262,780 B1

BACK-BIAS OPTIMIZATION

FIELD OF TECHNOLOGY

The following relates generally to one or more systems for memory and more specifically to back-bias optimization.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A device, such as an electronic device, may apply biasing voltages to various electronic components to prevent or mitigate deleterious electrical phenomena. For example, a device may apply a biasing voltage to the body (or "back") of transistors to mitigate current leakage. Such a process may be referred to as back-biasing. A device that employs back-biasing may include a biasing circuit that includes a voltage generator and a clamp circuit, which may each provide different back-bias voltages for use in different scenarios. Due to its size and complexity, the biasing circuit may be disposed on a substrate region of the device (e.g., a full-custom region) that is relatively free of component placement constraints. Conductive paths may couple the biasing circuit with various transistors, some of which may be disposed on another substrate region (e.g., a semi-custom region) that is subject to relatively restrictive component placement constraints. But the back-biasing voltage generated on one or more conductive paths may vary at different points on the one or more conductive paths due to the length of conductive path or the limited ability of the generator to control various conditions locally, which may negatively impact the efficacy of the back-biasing.

According to the techniques described herein, the variation of a biasing voltage on a conductive path may be reduced by placing clamp circuits at various intervals along one or more conductive paths, for example, within the semi-custom region. The size and simplicity of the clamp circuits, for example relative to one or more voltage generators, may allow for disposition on the semi-custom region, which means that the biasing voltage on the conductive path can be anchored (or "clamped") by the clamp circuits at various points along the conductive path, thereby reducing variation, among other advantages. Thus, the efficacy of back-biasing may be improved.

Features of the disclosure are initially described in the context of a system as described with reference to FIG. 1. Features of the disclosure are described in the context a device as described with reference to FIG. 2. These and other features of the disclosure are further illustrated by and described with reference to process flows that relate to back-bias optimization as described with reference to FIGS. 3A and 3B.

Figure 1:
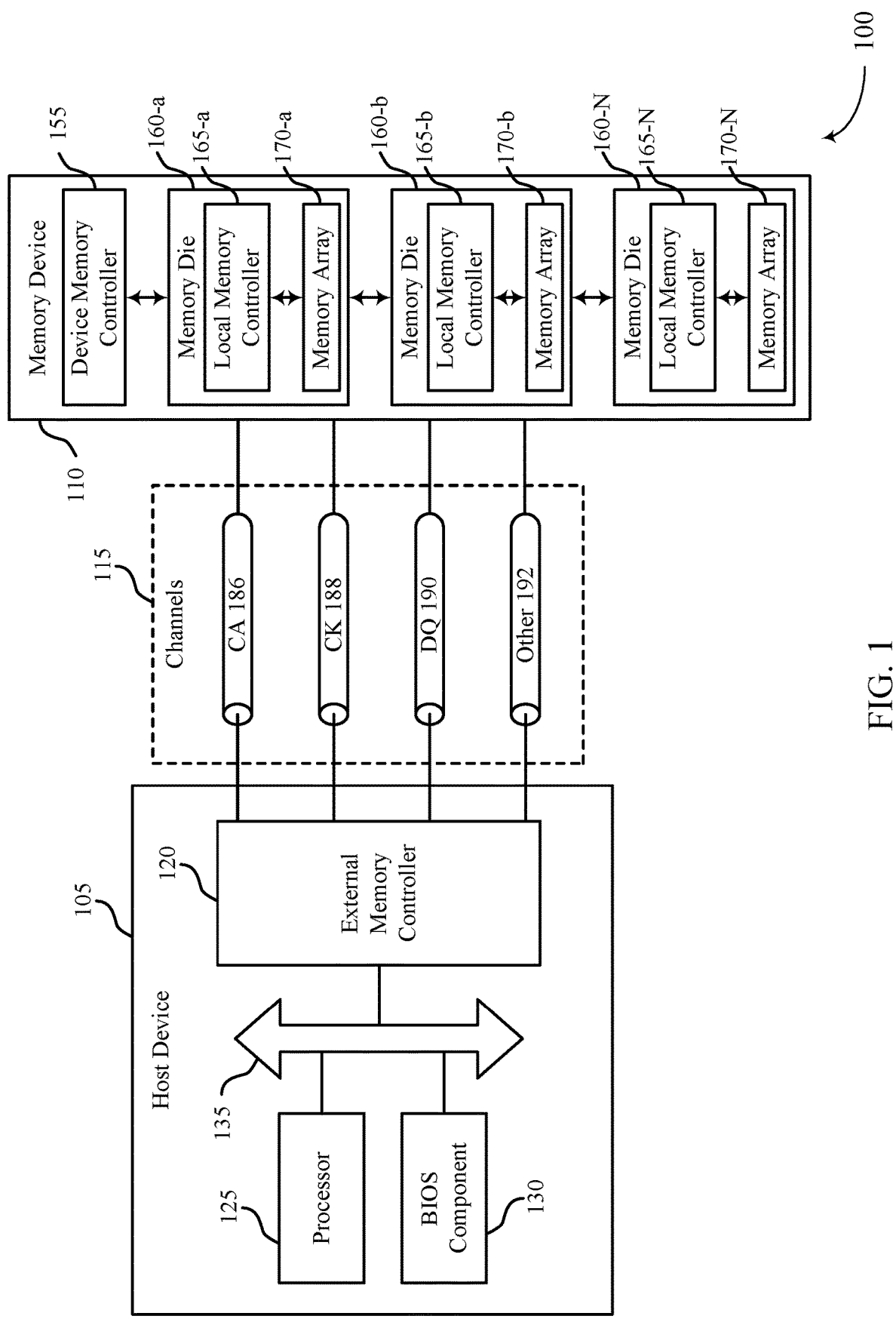
FIG. 1 illustrates an example of a system that supports back-bias optimization in accordance with examples as disclosed herein.

FIG. 1 illustrates an example of a system 100 that supports back-bias optimization in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The system 100 may include a variety of electronic components, such as switching components (e.g., transistors), to operate. To prevent transistors from leaking current—a phenomenon that negatively impacts the performance of the transistors—the system 100 may apply a biasing voltage to the body (or "back") of the transistors. Such a technique may be referred to as "back-biasing." Because different back-biasing voltages may be preferred for different scenarios, the system 100 may include a voltage generator that can provide a first set of back-biasing voltages (e.g., analog voltages) and a clamp circuit that can provide a second set of back-biasing voltages (e.g., the supply voltages of the circuit). The voltage generator and clamp circuit may be coupled together and, due to the size and complexity of the resulting circuit, may be disposed on a substrate region that is relatively free of component placement restrictions. For example, the combination of the voltage generator and clamp circuit may be disposed on a substrate region—referred to as a "full-custom region"—that is intended for relatively unrestricted customization in memory production or design.

The combination of the voltage generator and clamp circuit (collectively referred to as a biasing circuit herein) may be used to supply back-biasing voltages to transistors, for example throughout the device, including transistors disposed on a substrate region that is relatively encumbered with component placement restrictions. For example, the transistors may be disposed on a substrate region—referred to as a "semi-custom region"—that is intended for relatively restricted customization. To facilitate back-biasing of these transistors and others, the device may include one or more conductive paths that couple the transistors with the voltage generator and the clamp circuit. The conductive paths may traverse (e.g., span) the semi-custom region in some examples and thus may have a non-trivial length that affects back-biasing. For example, the back-biasing voltage along the conductive path may vary at different points based on the electrical distance from the voltage generator/clamp circuit (e.g., the back-biasing voltage may vary with the intervening length of the conductive path). So, the back-biasing voltages applied to transistors in the semi-custom region (and possibly other regions as alternative examples) may be inconsistent, which may negatively impact the efficacy of the back-bias.

According to the techniques described herein, a device, such as system 100, may reduce the variation of back-biasing voltages on one or more conductive paths by using one or more clamp circuits distributed along the conductive path(s) within the semi-custom region. Because the relative length of the conductive path(s) between clamp circuits is reduced compared to using voltage generators, the voltage along the conductive path(s) may be more consistent compared to other techniques that use one or more voltage generators/clamp circuit(s) outside the semi-custom region. Thus, the efficacy of back-biasing may be improved.

Figure 2:
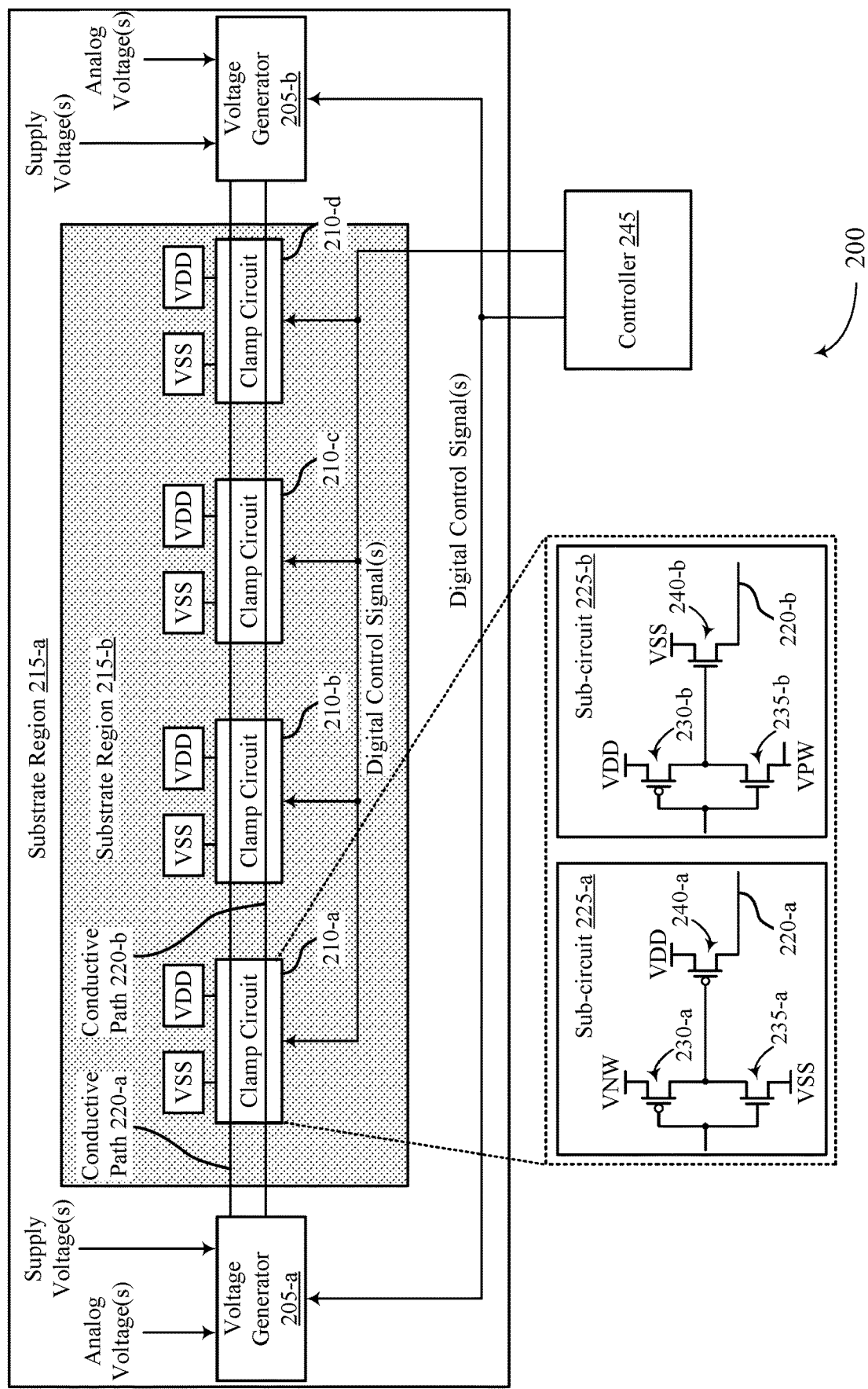
FIG. 2 illustrates an example of a device that supports back-bias optimization in accordance with examples as disclosed herein.

FIG. 2 illustrates an example of a device 200 that supports back-bias optimization in accordance with examples as disclosed herein. The device 200 may be an example of a system 100 or a memory device 110 as described with reference to FIG. 1. However, the techniques described herein can are not limited to the devices described herein and may be implemented by any type of device with multiple one or more substrate regions. The device 200 may include voltage generator 205-*a*, voltage generator 205-*b*, and clamp circuits 210-*a* through 210-*d*, among other components. The clamp circuits 210 may be distributed (e.g., positioned) along the conductive paths 220 so that the back-biasing voltages at different points along the conductive paths can have reduced variation (e.g., are more uniform) relative to other techniques.

Although described with reference to two conductive paths 220, the techniques described herein can be implemented for any quantity of conductive paths, including a single conductive path. A conductive path may also be referred to as a conductive line or a trace, among other suitable terminology. If a conductive path includes switching components (e.g., one or more transistors positioned along one or more conductive paths), the conductive path may be considered an activatable conductive path.

The device 200 may include multiple substrate regions (e.g., portions, sections, areas) with different characteristics and/or design constraints. For example, the device 200 may include substrate region 215-*a*, which may be a full-custom region, and substrate region 215-*b*, which may be a semi-custom region. In addition to other characteristics described herein, substrate region 215-*a* may have minimal or no restrictions for the placement or dimensions of components or wiring, whereas substrate region 215-*b* may have a variety of restrictions for placing components and wiring. In some examples, substrate region 215-*b* may have a wiring grid and substrate region 215-*a* may be free of a wiring grid. In some examples, substrate region 215-*b* may be configured as a pattern (e.g., matrix) of sub-regions (or "blocks") that are subject to the placement restrictions. As illustrated in FIG. 2, substrate region 215-*a* may at least partially or may fully surround substrate region 215-*b*. However, other configurations of the substrate regions 215 are contemplated and fall within the scope of the present disclosure.

The voltage generators 205 may generate (e.g., provide, create, supply, output) back-bias voltages for components of the device 200 (e.g., transistors disposed on substrate region 215-*b*, among other substrate regions). For example, the voltage generators 205 may generate a first voltage, referred to as "VPW" for biasing a first type of transistor, such as an n-type transistor, and a second voltage, referred to as "VNW" for biasing a second type of transistor, such as a p-type transistor. The back-bias voltages generated by the voltage generators 205 may be, in some examples, analog voltages that are based on one or more supply voltages, analog voltages, and/or pumped assist-voltages received by the voltage generators 205. In some examples, VPW is a negative voltage and VNW is a positive voltage. The voltage generators 205 may include various components—including large and complex components, such as voltage pumps and comparators—to generate VNW and VPW.

Although described with reference to two voltage generators 205, the techniques described herein can be implemented for any quantity of voltage generators, including a single voltage generator or more than two voltage generators. Similarly, the techniques described herein may be implemented for any quantity of back-biasing voltages. For example, the techniques describe herein may be implemented for a single back-biasing voltage (e.g., VNW or VPW) that is generated by the voltage generator(s) 205.

The voltage generators 205 may be powered by one or more supply voltages and may be controlled by digital control signals received from a controller such as controller 245. The controller 245 may be configured to control (e.g., enable, disable, activate, deactivate) any combination of the voltage generators 205 and the clamp circuits 210. Thus, the controller 245 may be coupled with one or more of the voltage generators 205 and one or more of the clamp circuits 210. In some examples, one or both of the voltage generators 205 may include or be coupled with a respective clamp circuit (not shown), which may be internal to or external to the voltage generators 205. In such a scenario, the clamp circuit may be said to be disposed on the substrate region 215-a.

The voltage generators 205 may work independently or together to generate the back-bias voltages on conductive paths 220. For example, the voltage generators 205 may generate VNW on conductive path 220-a and may generate VPW on conductive path 220-b. Use of multiple voltage generators 205 as shown may reduce the variation of VNW and VPW along the conductive lines; however, use of a single voltage generator 205 is also contemplated. Voltages on the conductive paths 220 may be propagated to various components of the device 200 via a distributive network (not shown) that may include one or more conductive lines, activatable conductive paths, and the like.

The clamp circuits 210 may be used to provide back-bias voltages, such as alternative back-bias voltages, for example when VPW and VNW are unsuitable or excessive for a given application or implementation. For example, each clamp circuit 210 may provide a first alternative voltage, referred to as VDD, for back-biasing n-type transistors and may provide a second alternative voltage, referred to as Vss, for back-biasing p-type transistors. The alternative voltages may be based on the normal or nominal supply voltages of the circuits, such as voltage supply VDD and voltage supply VS S.

Thus, the clamp circuits 210 may be coupled with one or more supply voltages. The alternative voltage VDD may be lower than VNW and the alternative voltage Vss may be higher than VPW. So, use of the alternatives voltages VDD, Vss may result in higher transistor performance (e.g., more drive current) compared to VNW, VPW, but a higher transistor leakage. Accordingly, the alternative voltages VDD, Vss may be appropriate for low-leakage scenarios. However, in high-leakage scenarios, VNW and VPW may be preferred over the alternative voltages VDD, Vss. Examples of low-leakage and high-leakage scenarios are described below. Compared to a voltage generator 205, which is large, complex, and includes multiple analog inputs, a clamp circuit 210 may be small, simple, and include digital inputs.

As illustrated in FIG. 2, the quantity of clamp circuits 210 in device 200 may be greater than the quantity of voltage generators 205. Although described with reference to four clamp circuits 210, the techniques described herein can be implemented for any quantity of clamp circuits. Similarly, the techniques described herein may be implemented for any quantity of alternative back-biasing voltages. For example, the techniques describe herein may be implemented for a single alternative back-biasing voltage (e.g., VDD or Vss) or for multiple back-biasing voltages.

Due to the size and complexity of the voltage generators 205, and the constraints of substrate region 215-b, the voltage generator 205s may be disposed on substrate region 215-a. For example, the voltage generators 205 may be disposed on substrate region 215-a because it is difficult or in some implementations impossible—even with automatic placement and routing (APR) tools—to place the voltage generator 205 in substrate region 215-b. However, the clamp circuits 210 may be placed within substrate region 215-b because the clamp circuits 210 are relatively simpler and smaller than the voltage generators 205. Distributing the clamp circuits 210 along the conductive paths 220 may reduce the variation in bias voltages at different points on the conductive paths 220, which may increase the efficacy of back-biasing.

As noted, a clamp circuit 210 may be used to couple a conductive path 220 to a voltage supply (e.g., VDD, VSS) so that an alternative back-bias voltage (e.g., VDD, Vss) develops on the conductive line. For example, a clamp circuit 210 may, when appropriated activated, couple conductive path 220-a with voltage supply VDD and couple conductive path 220-b with voltage supply VSS. Accordingly, a clamp circuit 210 may have multiple sub-circuits 225 for coupling the conductive paths 220. As an illustration, clamp circuit 210-a may include sub-circuit 225-a, which may be configured to couple conductive path 220-a with VDD, and clamp circuit 210-b, which may be configured to couple conductive path 220-b with VSS.

Sub-circuit 225-a may include transistor 230-a, transistor 235-a, and transistor 240-a, which may be activated and deactivated by applying the appropriate voltages. To couple conductive path 220-a with VDD, transistor 240-a may be activated. Transistor 240-a may be activated by deactivating transistor 230-a and activating transistor 235-a so that a sufficiently low voltage (e.g., Vss) is applied to the gate of transistor 240-a. Transistor 230-a may be deactivated and transistor 235-a may be activated (e.g., concurrently, for at least partially overlapping durations of time) by applying a common voltage (e.g., VDD) to the gate of transistor 230-a and to the gate of transistor 235-a. Thus, the gate of transistor 240-a may be isolated from VNW and may be coupled with VSS, which may cause transistor 240-a to conduct (e.g., transfer charge/current from VDD to conductive path 220-a). To isolate conductive path 220-a from VDD, the voltage applied to transistor 230-a and transistor 235-a may be modified (e.g., to Vss) so that transistor 230-a is activated, and transistor 235-a is deactivated. Thus, the gate of transistor 240-a may be isolated from VSS and may be coupled with VNW, which may cause transistor 240-a to turn off.

Sub-circuit 225-b may be operated similarly as sub-circuit 225-a. For example, to couple conductive path 220-b with VSS, transistor 240-b may be activated. Transistor 240-b may be activated by activating transistor 230-a and deactivating transistor 235-a so that a sufficiently high voltage (e.g., VDD) is applied to the gate of transistor 240-b. Transistor 230-b may be activated and transistor 235-b may be deactivated (e.g., concurrently) by applying a common voltage (e.g., Vss) to the gate of transistor 230-b and to the gate of transistor 235-b. Thus, the gate of transistor 240-b may be coupled with VDD and may be isolated from VPW, which may cause transistor 240-*b* to conduct (e.g., transfer charge/current from VSS to conductive path 220-*b*). To isolate conductive path 220-*b* from VSS, the voltage applied to transistor 230-*b* and transistor 235-*b* may be modified (e.g., to VDD) so that transistor 230-*b* is deactivated, and transistor 235-*b* is activated. Thus, the gate of transistor 240-*b* may be isolated from VDD and may be coupled with VPW, which may cause transistor 240-*b* to turn off. Although described with reference to transistors, the sub-circuits 225 may be implemented using any type of switching component.

As noted, the controller 245 may be configured to control a biasing mode of the device 200 by enabling and disabling the voltage generators 205 and the clamp circuits 210. In some examples, the controller 245 may be configured to enable the voltage generators 205 and the clamp circuits 210 (or any combination thereof) at different times so that when the voltage generators 205 are enabled the clamp circuits 210 are disabled, and vice versa. For example, when a high-leakage scenario is detected (e.g., determined, measured), the controller 245 may be configured to select and enter a first biasing mode, which may include enabling the voltage generators 205 (e.g., to compensate for the increased current leakage) and disabling the clamp circuits 210 (e.g., because the clamp circuits 210 are not needed).

One example of a high-leakage scenario may be when the device 200 undergoes burn-in, which may be a mode, such as a test mode, that stresses the device 200 (e.g., so that a manufacturer can address failure points). Because high temperatures and high voltages increase current leakage, operating modes that increase the operating temperature and/or operating voltages of the device 200—such as burn-in test modes—may be associated with increased current leakage. Another example of a high-leakage scenario may be when a device 200 has fast process corners. The term fast process corner may refer to switching components (e.g., transistors) with low threshold voltages and, accordingly, fast switching times (relative to nominal values for threshold voltages and switching times).

When a low-leakage scenario is encountered, the controller 245 may be configured to select and enter a second biasing mode, which may include enabling the clamp circuits 210 and disabling the voltage generators 205. The second biasing mode may provide sufficient back-biasing for low-leakage scenarios but with reduced power consumption relative to the first biasing mode. One example of a low-leakage scenario may be when the device 200 operates in a mode other than a burn-in test mode. Another example of a low-leakage scenario may be when a device 200 has slow process corners, which means that the device 200 has switching components (e.g., transistors) with high threshold voltages and, accordingly, slow switching times (relative to nominal values for threshold voltages and switching times). In some examples, entering the second biasing mode may occur before entering the first biasing mode. Alternatively, in some examples, entering the second biasing mode may occur after entering the first biasing mode.

So, the controller 245 may determine which biasing mode to enable based on the operating mode of the device 200 and/or based on the switching properties (e.g., threshold voltages, switching speeds) of the transistors in the device 200, among other factors or conditions. Although shown separate from the substrate regions 215, the controller 245 may be partially or wholly disposed on one or both of the substrate regions 215.

Thus, distributed clamp circuits 210 may be used to reduce the variation of back-biasing voltages along the conductive path 220.

In some examples, the controller 245 or another circuit (e.g., a circuit on a memory of the device 200) may select the biasing mode based on the temperature of the memory, which may be measured by the controller 245 or the other circuit. For example, the device 200 may switch from the second biasing mode (which may be referred to as "clamp mode") to the first biasing mode (which may be referred to as "generator mode") when the temperature of the memory reaches a threshold temperature. Additionally or alternatively, the biasing mode may be controlled by a measurement circuit (e.g., a ring-oscillator) that characterizes the process corner of the device 200. For example, a ring-oscillator on the device 200 may measure the oscillation frequency of various aspects of the device 200. If the oscillation frequency satisfies a threshold frequency that is associated with or indicative of a fast process corner, the device 200 may select the first biasing mode for use. Otherwise, the device 200 may select the second biasing mode for use.

Figure 3A:
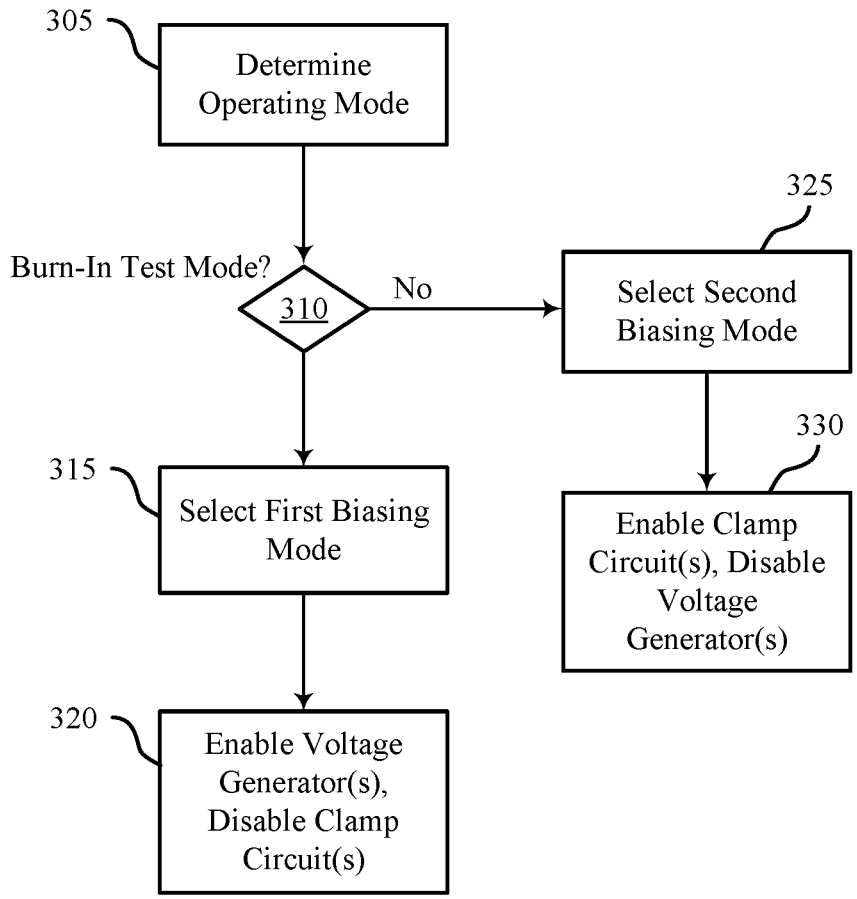
FIGS. 3A and 3B illustrate examples of process flows that support back-bias optimization in accordance with examples as disclosed herein.

FIG. 3A illustrates an example of a process flow 300-*a* that supports back-bias optimization in accordance with examples as disclosed herein. The process flow 300-*a* may be implemented by a device and/or a controller as described herein. The process flow 300-*a* may allow a device with one or more voltage generator(s) and one or more distributed clamp circuit(s) to strategically enable/disable the voltage generator(s) and the clamp circuit(s) based on the operating mode of the device.

At 305, the device may determine an operating mode of the device. In some examples, the device may determine the operating mode based on a mode register that is included in the device and that indicates the operating mode using one or more bits. Alternatively, the device may determine an operating mode based on an indication received from another device. For example, the device may receive an indication (e.g., from a host device) that may indicate an operating mode of the device to be used. In some examples, the device may determine the operating mode based on the device being turned on or exiting a low power mode. At 310, the device may determine whether the device is in a burn-in test mode (or other operating mode associated with high-leakage).

If, at 310, the device determines that the device is in the burn-in test mode, the device may, at 315, select the first biasing mode based on the device being in the burn-in test mode. At 320, the device may enable the voltage generator(s) and disable the clamp circuit(s) based on selecting the first biasing mode. Thus, the device may effectively back-bias transistors of the device while the device is in the burn-in test mode.

If, at 310, the device determines that the device is in a mode other than the burn-in test mode, the device may, at 325, select the second biasing mode based on the device being in a mode other than the burn-in test mode. At 330, the device may disable the voltage generator(s) and enable the clamp circuit(s) based on selecting the second biasing mode. Thus, the device may save power, compared to the first biasing mode, while effectively back-biasing transistors of the device while the device is in a mode other than the burn-in test mode.

In summary, the device may strategically enable/control the voltage generator(s) and the clamp circuit(s) based on the operating mode of the device.

Figure 3B:
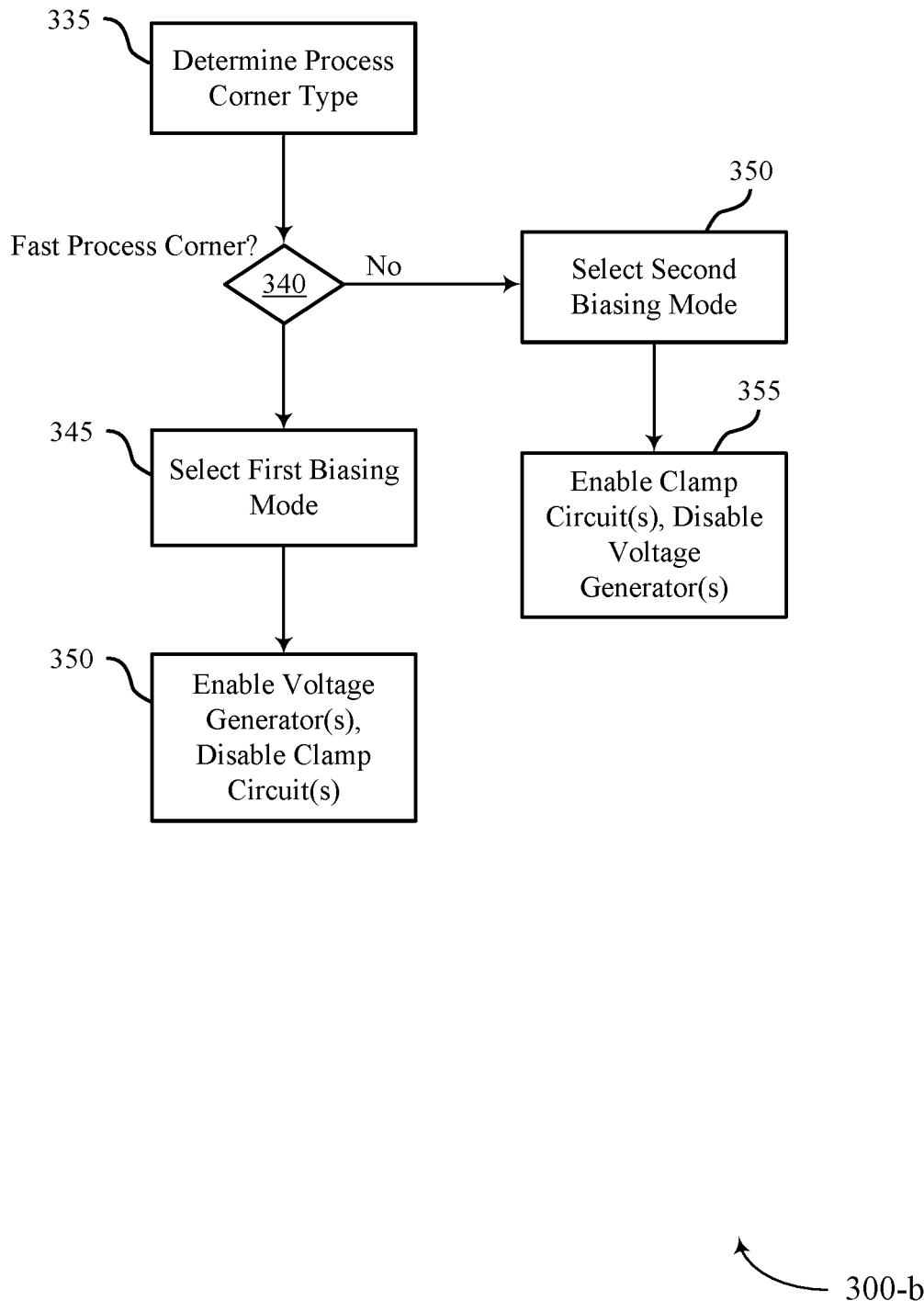

FIG. 3B illustrates an example of a process flow 300-*b* that supports back-bias optimization in accordance with examples as disclosed herein. The process flow 300-*b* may be implemented by a device and/or a controller as described herein. The process flow 300-*b* may allow a device with one or more voltage generator(s) and one or more distributed clamp circuit(s) to strategically enable/disable the voltage generator(s) and the clamp circuit(s) based on the process corner of the device. In some examples, the process flow 300-*b* may follow or be used in conjunction with the process flow 300-*a*.

At 335, the device may determine the type of process corner associated with the device. In some examples, the device may determine the type of process corner based on a fuse or other circuit that is included in the device and that indicates the type of process corner. Thus, the fuse may directly or indirectly indicate a switching property (e.g., a threshold voltage, a switching speed) of transistors in the device. A fuse may refer to a circuit that is configured permanently or semi-permanently in an open-circuit or closed-circuit state. So, the state of a fuse may indicate the type of process corner associated with the device (e.g., an open-circuit fuse may indicate a fast process corner whereas a closed-circuit fuse may indicate a slow process corner).

In some examples, the device may determine the type of process corner using an on-die measurement circuit (e.g., a circuit on the memory die or other component of the device). For example, the device may determine the type of process corner based on the temperature of the memory die, which may be determined by an on-die temperature measurement circuit. As another example, the device may determine the type of process corner based on the oscillation frequency of one or more components as measured by a ring-oscillator.

At 340, the device may determine whether the device is associated with a fast process corner.

If, at 340, the device determines that the device is associated with a fast process corner, the device may, at 345, select the first biasing mode based on the device associated with a fast process corner. When an on-die measurement circuit is used, the device may determine that the device is associated with a fast process corner based on the temperature of the memory die (or another die) satisfying a threshold temperature and/or based on the oscillation frequency of the memory die (or other component) satisfying a threshold frequency. At 350, the device may enable the voltage generator(s) and disable the clamp circuit(s) based on selecting the first biasing mode. Thus, the device may effectively back-bias transistors of the device that have low threshold voltages and/or fast switching properties.

If, at 340, the device determines that the device is associated with a process corner other than a fast process corner (e.g., a slow process corner), the device may, at 350, select the second biasing mode based on the device being associated with the process corner other than the fast process corner. When an on-die measurement circuit is used, the device may determine that the device is associated with process corner other than a fast process corner based on the temperature of the memory die (or another die) failing to satisfy a threshold temperature and/or based on the oscillation frequency of the memory die (or other component) failing to satisfy a threshold frequency. At 355, the device may disable the voltage generator(s) and enable the clamp circuit(s) based on selecting the second biasing mode. Thus, the device may save power, compared to the first biasing mode, while effectively back-biasing transistors of the device that have high threshold voltages and/or slow switching properties (relative to threshold values).

In summary, the device may strategically enable/control the voltage generator(s) and the clamp circuit(s) based on the process corner of the device.

In some examples, the device may switch between the first biasing more and the second biasing mode or more times based on the operating mode of the device and/or the process corner of the device. In some examples, the device may use the first biasing mode for back-biasing a first type of switching component and may use the second biasing mode for a second type of switching component. In such examples, the first biasing mode and second biasing mode may be enabled concurrently (e.g., for at least partially overlapping times). In some examples, the device may select between the first biasing mode and the second biasing mode based on a power status of the device (e.g., based on a remaining battery power of the device or based on access to a power source). In some examples, the device may select between the first biasing mode and the second biasing mode based on a desired performance level for the back-biasing.

It should be noted that the techniques and methods described herein describe possible implementations, and that the operations and the steps may be rearranged or otherwise modified and that other implementations are possible. Further, portions from two or more of the methods may be combined.

An apparatus is described. The apparatus may include a first substrate region and a second substrate region, a voltage generator disposed on the first substrate region and including an output terminal coupled with a conductive path, and a plurality of clamp circuits disposed on the second substrate region, the plurality of clamp circuits each configurable to couple the conductive path with a voltage supply.

In some examples, the apparatus includes a clamp circuit disposed on the first substrate region and coupled with the voltage generator.

In some examples, the apparatus includes a controller coupled with the voltage generator and the plurality of clamp circuits, the controller configured to independently enable and disable the voltage generator and enable and disable the plurality of clamp circuits.

In some examples of the apparatus, the controller may be configured to enable or disable the voltage generator and enable or disable the plurality of clamp circuits based at least in part on an operating mode of the apparatus.

In some examples, the apparatus may include a mode register configured to indicate an operating mode of the apparatus, where the controller may be configured to enable or disable the voltage generator and enable or disable the plurality of clamp circuits based at least in part on the operating mode indicated by the mode register.

In some examples, the apparatus may include a fuse configured to indicate a switching property of transistors in the apparatus, where the controller may be configured to enable or disable the voltage generator and the plurality of clamp circuits based at least in part on the switching property.

In some examples, the apparatus may include a second conductive path coupled with a second output terminal of the voltage generator, where the plurality of clamp circuits may be configurable to couple the second conductive path with a second voltage supply. In some examples of the apparatus, each clamp circuit in the plurality of clamp circuits includes a first transistor coupled with the conductive path and the voltage supply and a second transistor coupled with the second conductive path and the second voltage supply.

In some examples, the apparatus includes a second voltage generator disposed on the first substrate region and including an output terminal coupled with the conductive path. In some examples of the apparatus, the voltage generator and the second voltage generator may be on opposite sides of the second substrate region.

In some examples of the apparatus, the conductive path spans an entire length of the second substrate region and the plurality of clamp circuits are distributed along the conductive path. In some examples of the apparatus, the second substrate region may be at least partially surrounded by the second substrate region on two sides.

In some examples of the apparatus, the second substrate region may be subject to a set of constraints, not followed by the first substrate region, for placing one or more of wiring or components. In some examples of the apparatus, the second substrate region may be a peripheral substrate region that includes matrixed sub-regions that may be subject to the set of constraints, and each clamp circuit may be disposed on a respective sub-region of the matrixed sub-regions.

Another apparatus is described. The apparatus may include a first substrate region and a second substrate region, a voltage generator disposed on the first substrate region and configured to generate a first voltage on a first conductive path and a second voltage on a second conductive path, the first and second voltages for biasing transistors in at least the second substrate region, and a plurality of clamp circuits disposed on the second substrate region and coupled with the voltage generator, where each clamp circuit in the plurality of clamp circuits is configured to provide a third voltage to the first conductive path and a fourth voltage to the second conductive path, the third and fourth voltages for biasing the transistors In some examples of the apparatus, the first conductive path may be coupled with transistors of a first type and the second conductive path may be coupled with transistors of a second type.

In some examples of the apparatus, the transistors of the first type include p-type transistors and the transistors of the second type include n-type transistors.

In some examples, the apparatus may include a controller configured to separately enable the voltage generator during a first duration and the plurality of clamp circuits during a second duration that may be non-overlapping with the first duration. In some examples of the apparatus, the controller may be configured to enable the voltage generator and disable the plurality of clamp circuits based at least in part on determining that the apparatus may be in a test mode. In some examples of the apparatus, the controller may be configured to enable the voltage generator and disable the plurality of clamp circuits based at least in part on determining that the transistors may have switching speeds equal to or faster than a threshold switching speed. In some examples of the apparatus, the controller may be configured to enable the plurality of clamp circuits and disable the voltage generator based at least in part on determining that the transistors may have switching speeds slower than a threshold switching speed.

In some examples, the apparatus may include a controller configured to select a first biasing mode or a second biasing mode based at least in part on a switching property of the transistors or an operating mode of the apparatus, where the controller may be configured to enable or disable the voltage generator and enable or disable the plurality of clamp circuits based at least in part on the selected biasing mode. In some examples of the apparatus, the first voltage may be higher than the third voltage and the second voltage may be lower than the fourth voltage.

Another apparatus is described. The apparatus may include a first voltage generator disposed on a first substrate region, the first voltage generator configured to generate a first voltage and a second voltage for biasing transistors in a second substrate region, a second voltage generator disposed on the first substrate region, the second voltage generator configured to generate the first voltage and the second voltage for biasing the transistors, and a clamp circuit disposed on the second substrate region, which is at least partially surrounded by the first substrate region, and configurable to provide a third voltage and a fourth voltage for biasing the transistors In some examples, the apparatus may include a first conductive path coupled with the first voltage generator and the second voltage generator, where the first voltage generator and the second voltage generator may be each configured to generate the first voltage on the first conductive path. In some examples, the apparatus may include a first voltage supply coupled with the clamp circuit, where the clamp circuit may be configured to provide the third voltage to the first conductive path from the first voltage supply.

In some examples, the apparatus may include a second conductive path coupled with the first voltage generator and the second voltage generator, where the first voltage generator and the second voltage generator may be each configured to generate the second voltage on the second conductive path. In some examples, the apparatus may include a second voltage supply coupled with the clamp circuit, where the clamp circuit may be configured to provide the fourth voltage to the second conductive path from the second voltage supply.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow. As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a first substrate region and a second substrate region, the second substrate region configured for components smaller than a threshold size;
   a voltage generator disposed on the first substrate region and comprising an output terminal coupled with a conductive path, the voltage generator larger than the threshold size;
   a plurality of clamp circuits disposed on the second substrate region, the plurality of clamp circuits each configurable to couple the conductive path with a voltage supply and each smaller than the threshold size; and
   a controller coupled with the voltage generator and the plurality of clamp circuits, the controller configured to independently enable and disable the voltage generator and enable and disable the plurality of clamp circuits.

2. The apparatus of claim 1, further comprising:
   a clamp circuit disposed on the first substrate region and coupled with the voltage generator.

3. The apparatus of claim 1, wherein the controller is configured to enable or disable the voltage generator and enable or disable the plurality of clamp circuits based at least in part on an operating mode of the apparatus.

4. The apparatus of claim 1, further comprising:
   a mode register configured to indicate an operating mode of the apparatus, wherein the controller is configured to enable or disable the voltage generator and enable or disable the plurality of clamp circuits based at least in part on the operating mode indicated by the mode register.

5. The apparatus of claim 1, further comprising:
   a fuse configured to indicate a switching property of transistors in the apparatus, wherein the controller is configured to enable or disable the voltage generator and the plurality of clamp circuits based at least in part on the switching property.

6. The apparatus of claim 1, further comprising:
   a second conductive path coupled with a second output terminal of the voltage generator, wherein the plurality of clamp circuits are configurable to couple the second conductive path with a second voltage supply.

7. The apparatus of claim 1, further comprising:
   a second voltage generator disposed on the first substrate region and comprising an output terminal coupled with the conductive path.

8. The apparatus of claim 7, wherein the voltage generator and the second voltage generator are on opposite sides of the second substrate region.

9. The apparatus of claim 1, wherein the conductive path spans an entire length of the second substrate region and the plurality of clamp circuits are distributed along the conductive path.

10. The apparatus of claim 1, wherein the second substrate region is at least partially surrounded by the second substrate region on two sides.

11. An apparatus, comprising:
    a first substrate region and a second substrate region, the second substrate region configured for components smaller than a threshold size;
    a voltage generator disposed on the first substrate region and comprising an output terminal coupled with a conductive path, the voltage generator larger than the threshold size;
    a plurality of clamp circuits disposed on the second substrate region, the plurality of clamp circuits each configurable to couple the conductive path with a voltage supply and each smaller than the threshold size; and
    a second conductive path coupled with a second output terminal of the voltage generator, wherein the plurality of clamp circuits are configurable to couple the second conductive path with a second voltage supply, and wherein each clamp circuit in the plurality of clamp circuits comprises:
    a first transistor coupled with the conductive path and the voltage supply; and
    a second transistor coupled with the second conductive path and the second voltage supply.

12. An apparatus, comprising:
    a first substrate region and a second substrate region, the second substrate region configured for components smaller than a threshold size, wherein the second substrate region is subject to a set of constraints, not followed by the first substrate region, for placing one or more of wiring or components;
    a voltage generator disposed on the first substrate region and comprising an output terminal coupled with a conductive path, the voltage generator larger than the threshold size; and
    a plurality of clamp circuits disposed on the second substrate region, the plurality of clamp circuits each configurable to couple the conductive path with a voltage supply and each smaller than the threshold size.

13. The apparatus of claim 12, wherein the second substrate region is a peripheral substrate region that comprises matrixed sub-regions that are subject to the set of constraints, and wherein each clamp circuit is disposed on a respective sub-region of the matrixed sub-regions.

14. An apparatus, comprising:
    a first substrate region and a second substrate region, the second substrate region configured for components smaller than a threshold size;

a voltage generator, larger than the threshold size, that is disposed on the first substrate region and configured to generate a first voltage on a first conductive path and a second voltage on a second conductive path, the first and second voltages for biasing transistors in at least the second substrate region; and a plurality of clamp circuits disposed on the second substrate region and coupled with the voltage generator, wherein each clamp circuit in the plurality of clamp circuits is smaller than the threshold size and configured to provide a third voltage to the first conductive path and a fourth voltage to the second conductive path, wherein the third and fourth voltages are for biasing the transistors, and wherein the first voltage is higher than the third voltage and the second voltage is lower than the fourth voltage.

15. The apparatus of claim 14, wherein the first conductive path is coupled with transistors of a first type and the second conductive path is coupled with transistors of a second type.

16. The apparatus of claim 15, wherein the transistors of the first type comprise p-type transistors and the transistors of the second type comprise n-type transistors.

17. The apparatus of claim 14, further comprising:
a controller configured to separately enable the voltage generator during a first duration and the plurality of clamp circuits during a second duration that is non-overlapping with the first duration.

18. The apparatus of claim 17, wherein the controller is configured to:
enable the voltage generator and disable the plurality of clamp circuits based at least in part on determining that the apparatus is in a test mode.

19. The apparatus of claim 17, wherein the controller is configured to:
enable the plurality of clamp circuits and disable the voltage generator based at least in part on determining that the transistors have switching speeds slower than a threshold switching speed.

20. The apparatus of claim 14, further comprising:
a controller configured to select a first biasing mode or a second biasing mode based at least in part on a switching property of the transistors or an operating mode of the apparatus, wherein the controller is configured to enable or disable the voltage generator and enable or disable the plurality of clamp circuits based at least in part on the selected biasing mode.

21. An apparatus, comprising:
a first substrate region and a second substrate region, the second substrate region configured for components smaller than a threshold size;
a voltage generator, larger than the threshold size, that is disposed on the first substrate region and configured to generate a first voltage on a first conductive path and a second voltage on a second conductive path, the first and second voltages for biasing transistors in at least the second substrate region;

a plurality of clamp circuits disposed on the second substrate region and coupled with the voltage generator, wherein each clamp circuit in the plurality of clamp circuits is smaller than the threshold size and configured to provide a third voltage to the first conductive path and a fourth voltage to the second conductive path, the third and fourth voltages for biasing the transistors; and a controller configured to separately enable the voltage generator during a first duration and the plurality of clamp circuits during a second duration that is non-overlapping with the first duration, wherein the controller is configured to:
enable the voltage generator and disable the plurality of clamp circuits based at least in part on determining that the transistors have switching speeds equal to or faster than a threshold switching speed.

22. An apparatus, comprising:
a first voltage generator disposed on a first substrate region, the first voltage generator configured to generate a first voltage and a second voltage for biasing transistors in a second substrate region that is configured for components smaller than a threshold size, wherein the first voltage generator is larger than the threshold size;
a second voltage generator disposed on the first substrate region, the second voltage generator larger than the threshold size and configured to generate the first voltage and the second voltage for biasing the transistors; and
a clamp circuit that is smaller than the threshold size and disposed on the second substrate region, which is at least partially surrounded by the first substrate region, and configurable to provide a third voltage and a fourth voltage for biasing the transistors.

23. The apparatus of claim 22, further comprising:
a first conductive path coupled with the first voltage generator and the second voltage generator, wherein the first voltage generator and the second voltage generator are each configured to generate the first voltage on the first conductive path; and
a first voltage supply coupled with the clamp circuit, wherein the clamp circuit is configured to provide the third voltage to the first conductive path from the first voltage supply.

24. The apparatus of claim 23, further comprising:
a second conductive path coupled with the first voltage generator and the second voltage generator, wherein the first voltage generator and the second voltage generator are each configured to generate the second voltage on the second conductive path; and
a second voltage supply coupled with the clamp circuit, wherein the clamp circuit is configured to provide the fourth voltage to the second conductive path from the second voltage supply.

* * * * *